United States Patent
Galvez et al.

(10) Patent No.: US 8,618,570 B2
(45) Date of Patent: Dec. 31, 2013

(54) LED LIGHT ENGINE AND METHOD OF MANUFACTURE THEREOF

(75) Inventors: Miguel Galvez, Danvers, MA (US); Maria Anc, Groveland, MA (US)

(73) Assignee: Osram Sylvania Inc., Danvers, MA (US)

( * ) Notice: Subject to any disclaimer, the term of this patent is extended or adjusted under 35 U.S.C. 154(b) by 183 days.

(21) Appl. No.: 13/318,629

(22) PCT Filed: Apr. 28, 2010

(86) PCT No.: PCT/US2010/032700
§ 371 (c)(1),
(2), (4) Date: Nov. 3, 2011

(87) PCT Pub. No.: WO2010/129320
PCT Pub. Date: Nov. 11, 2010

(65) Prior Publication Data
US 2012/0068205 A1 Mar. 22, 2012

Related U.S. Application Data

(60) Provisional application No. 61/176,758, filed on May 8, 2009.

(51) Int. Cl.
*H01L 33/00* (2010.01)

(52) U.S. Cl.
USPC ........ 257/98; 257/100; 257/E33.059; 438/27; 438/29

(58) Field of Classification Search
USPC .................. 257/79, 89, 95, 98, 100, E33.059; 438/27, 26, 28, 29
See application file for complete search history.

(56) References Cited

U.S. PATENT DOCUMENTS

| 7,618,157 | B1 | 11/2009 | Galvez et al. | |
| 7,842,960 | B2 * | 11/2010 | Reginelli et al. | 257/98 |
| 7,897,985 | B2 | 3/2011 | Galvez | |
| 2007/0221938 | A1 * | 9/2007 | Radkov et al. | 257/98 |
| 2008/0054280 | A1 * | 3/2008 | Reginelli et al. | 257/98 |
| 2008/0211386 | A1 | 9/2008 | Choi et al. | |
| 2008/0246044 | A1 | 10/2008 | Pang | |
| 2009/0001399 | A1 | 1/2009 | Diana et al. | |

FOREIGN PATENT DOCUMENTS

| CN | 1652357 | 10/2005 |
| JP | 2009-088235 | 4/2009 |

OTHER PUBLICATIONS

Abstract, JP 2009-088235 (Apr. 23, 2009).
Abstract, CN 1652357, published Oct. 8, 2005.

* cited by examiner

*Primary Examiner* — Tuan N. Quach
(74) *Attorney, Agent, or Firm* — Robert F. Clark

(57) ABSTRACT

A light emitting diode (LED) light engine includes a solid transparent dome mounted on one or more LED dies to form a base module, a flexible sheath having embedded therein a phosphor that converts light of a first wavelength range to light of a second wavelength range, the sheath being attached to the base module so that the sheath conforms to a light emitting surface of the dome. The sheath emits light of the second wavelength range when the LED is emitting light of the first wavelength range. Further sheaths may be formed each with different phosphors or phosphor blends, and one of the sheaths may be selected to cover the base module depending on the color of light to be produced by the light engine.

11 Claims, 1 Drawing Sheet

LED LIGHT ENGINE AND METHOD OF MANUFACTURE THEREOF

CROSS REFERENCES TO RELATED APPLICATIONS

This application is a U.S. National Stage application of, and claims the benefit of, International Application No. PCT/US2010/032700, filed Apr. 28, 2010, which claims the benefit of U.S. Provisional Application No. 61/176,758, filed May 8, 2009.

BACKGROUND OF THE INVENTION

The present invention is directed to a light emitting diode (LED) light engine and a method of manufacturing the light engine.

In a conventional method of making an LED light engine that emits light of a color other than a color emitted by the LED, a phosphor is used to convert the light emitted from the LED to produce the desired emission color. The phosphor is selected depending on the wavelengths emitted by the LED and the overall color of the light to be emitted by the light engine.

For example, in an LED light engine that emits white light, a blue LED is embedded in or covered with a lens or case (the LED optic) made of a high index of refraction transparent polymer, such as silicone. A phosphor that converts the blue light to yellow light (for example, a YAG:Ce phosphor) may be mixed with the polymer to provide volumetric blue light conversion. The yellow light emitted by the phosphor combines with the residual unconverted blue light from the LED to produce an overall white emission from the LED light engine.

A portion of the light going through the phosphor undergoes a Stokes shift as it is converted from one wavelength range to another wavelength range. Thus, phosphor-based LEDs have a lower efficiency than normal LEDs due to the heat loss from the Stokes shift. Moreover, the proximity of the phosphor to the LED die leads to lumen degradation of the package due to the heat produced by the die and by the Stokes shift. Nevertheless, the phosphor method is a popular technique for manufacturing white LEDs.

Accordingly, LED light engines, particularly those that produce white light, require thoughtful thermal design.

SUMMARY OF THE INVENTION

An object of the present invention is to improve the thermal design of LED light engines and improve manufacturing flexibility by providing a novel LED light engine and method of making the LED light engine in which an LED base module is covered with a flexible sheath that is impregnated with a phosphor or a blend of phosphors that converts light from the LED base module to light of a different color.

A further object of the present invention is to provide a novel LED light engine and method of making the light engine in which a solid transparent dome is mounted on one or more LED dies to form a base module, a flexible silicone sheath is made with a phosphor embedded therein that converts light of a first wavelength range to light of a second wavelength range, and the sheath is attached to the base module so that the sheath conforms to a light emitting surface of the dome. The sheath emits light of the second wavelength range when the LED is emitting light of the first wavelength range. Further sheaths may be formed each with different phosphors or phosphor blends, and one of the sheaths may be selected to cover the base module depending on the color of light to be produced by the light engine.

These and other objects and advantages of the invention will be apparent to those of skill in the art of the present invention after consideration of the following drawings and description of preferred embodiments.

DESCRIPTION OF PREFERRED EMBODIMENTS

Figure 1:
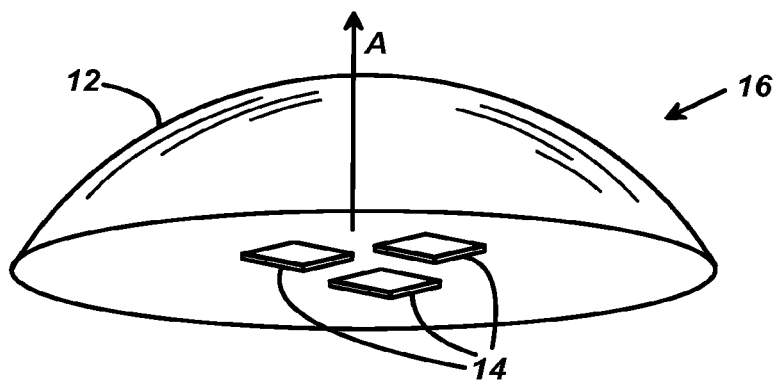
FIG. 1 is a pictorial representation of an LED base module of an embodiment of the present invention.
Figure 2:
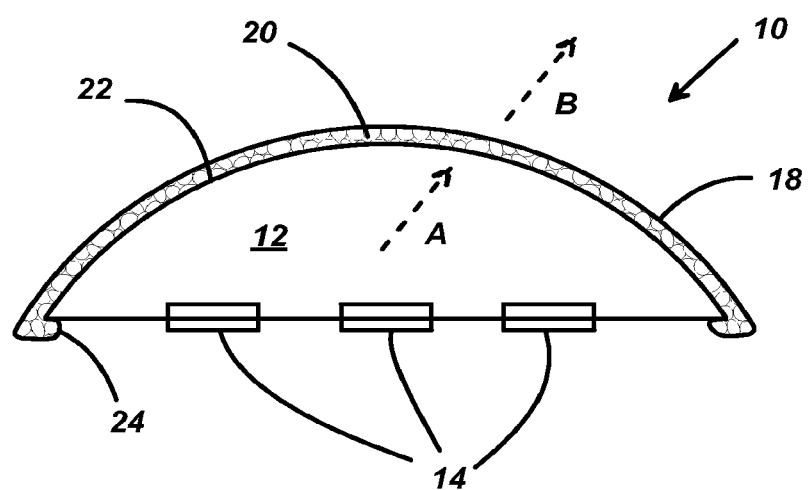
FIG. 2 is a cross sectional representation of the present invention.

With reference now to FIGS. 1 and 2, an embodiment of the present invention is an LED light engine 10 and a method of making the same. The light engine includes a substantially transparent solid dome 12 mounted on one or more LED dies 14 to form a base module 16. The LED dies 14 emit light of a first wavelength range A through a light emitting surface of the dome (e.g., the curved exterior surface of the dome.) A flexible sheath 18 is made having a embedded therein a phosphor 20 that converts light of the first wavelength range A to light of a second wavelength range B different from the first wavelength range. After making the base module 16 and the sheath 18 separately, the sheath is attached to the base module 16 so that the sheath 18 conforms to a shape of the light emitting surface of the dome 12. The sheath emits light of the second wavelength range when the LED dies emit light of the first wavelength range.

The dome 12 is preferably a solid silicone material. Preferably, there is nothing in the dome that would affect the heat budget of the dome (such as phosphors.) The dome may be molded over the LED dies so that the LED dies 14 are mounted on the bottom of the dome. Alternatively, the LED dies may be mounted on a substrate with the dome mounted on the substrate. In either event, the base module 16 includes the dome and LED dies operably connected so that light of the first wavelength range is emitted from the light emitting surface of the dome.

The size of the dome 12 depends on the particular application and the number of LED dies on which the dome is to be mounted, and may be, for example, several centimeters in diameter. Desirably the dome 12 has a standard size or sizes so that a plurality of base modules 16 may be made and stored (without the sheath thereon) to facilitate the manufacture of light engines of different emission colors.

The sheath 18 may be silicone and is desirably flexible and resilient (much like an inflatable balloon) so that the sheath can stretch and fit conformably onto the light emitting surface of the dome 12. The sheath may be thin, for example about 1 mm. The sheath also may be affixed to the dome with an adhesive 22. Alternatively, the sheath can snap-fit onto the dome (for example, with a resiliently deformable narrow neck 24 of the sheath under the bottom of the dome) so that the sheath can be removed and replaced with a sheath with a different phosphor. In such case, the sheath can be a polycarbonate, polypropylene, or other clear plastic with a high index of refraction.

The sheath 18 may be made by mixing the phosphor 20 into a silicone material, where the amount of the phosphor is determined based on a thickness of the sheath, and the silicone material mixture may be poured into a mold. Alternatively, the sheath 18 may be made by mixing the phosphor 20 into a plastic material, where the amount of the phosphor is determined based on a thickness of the sheath, and the plastic material mixture may be extruded to form the sheath.

When using a blue LED, the phosphor 20 may be a YAG:Ce phosphor for a cool white light emission B, and may optionally include additional phosphors for a desired light characteristic, such as blends containing red-emitting phosphors for increased color warmth. Other suitable phosphors may be used depending on the color of the light of the first wavelength range A emitted from the LED optic and the particular color desired that determines the second wavelength range B.

The present invention has advantages over the prior art LED modules that place the phosphor in an optic of the LED adjacent to the LED die. For example, in the present invention the sheath is separated from the LED die by the solid dome and thus the phosphor in the sheath is less susceptible to lumen degradation caused by the heat from the LED. Further, since the surface area of the sheath is relatively large, the heat from the Stokes shift spreads over a large area and thus the thermal budget of the light engine is improved.

In addition, the sheaths may be produced separately from the base modules, where both the sheaths and base modules are made and stored in standard shapes and sizes. Thereafter, the appropriate sheath may be attached to the appropriate base module, depending on the desired emission color and application, to improve flexibility in the manufacturing process. Moreover, the use of standard parts improves inventory management.

While embodiments of the present invention have been described in the foregoing specification and drawings, it is to be understood that the present invention is defined by the following claims when read in light of the specification and drawings.

We claim:

1. A method of making a light emitting diode (LED) light engine comprising the steps of:
    forming a plurality of base modules, wherein each base module is formed by mounting a substantially transparent solid dome over one or more LED dies, the one or more LED dies being adapted to emit light of a first wavelength range through a light emitting surface of the dome;
    making a first flexible sheath having embedded therein a phosphor or a phosphor blend that converts light of the first wavelength range to light of a second wavelength range different from the first wavelength range;
    making a second flexible sheath that has embedded therein a second phosphor or a second phosphor blend that converts light of the first wavelength range to a further wavelength range different from the first and second wavelength ranges;
    selecting one of the first and second sheaths for attachment to one of the plurality of base modules depending on the color of light to be emitted by the light engine; and
    attaching the selected sheath to the base module so that the selected sheath conforms to a shape of the light emitting surface of the dome.

2. The method of claim 1, wherein the first wavelength range is blue light and the phosphor comprises YAG:Ce, so that the second wavelength range is yellow light.

3. The method of claim 1, wherein the dome is comprised of silicone.

4. The method of claim 1, wherein the step of making the first sheath includes mixing the phosphor into a silicone material, an amount of the phosphor being related to a thickness of the first sheath.

5. The method of claim 1, before the selecting step, further comprising the step of retrievably storing the plurality of base modules and a plurality of each of the first and second sheaths.

6. A light emitting diode (LED) light engine comprising:
    a substantially transparent solid dome mounted on one or more LED dies to form a base module, the one or more LED dies being adapted to emit light of a first wavelength range through a light emitting surface of the dome; and
    a flexible sheath having embedded therein a phosphor or a phosphor blend that converts light of the first wavelength range to light of a second wavelength range different from the first wavelength range,
    the sheath being attached to the base module so that the sheath conforms to a shape of the light emitting surface of the dome, the sheath having a resiliently flexible neck smaller than a diameter of the dome, the neck being adjacent to a surface of the dome opposite the light emitting surface to which a body of the sheath conforms,
    wherein light of the second wavelength range is emitted from the sheath when the one or more LED dies is emitting light of the first wavelength range.

7. The light engine of claim 6, wherein the first wavelength range is blue light and the phosphor comprises YAG:Ce, so that the second wavelength range is yellow light.

8. The light engine of claim 6, wherein the dome is comprised of silicone.

9. The light engine of claim 6, wherein the sheath comprises silicone.

10. The light engine of claim 6, further comprising an adhesive that holds the sheath on the light emitting surface of the dome.

11. The light engine of claim 6, wherein the sheath comprises a polycarbonate or a polypropylene plastic.

* * * * *